(12) United States Patent
Pelgrom et al.

(10) Patent No.: US 7,710,136 B2
(45) Date of Patent: May 4, 2010

(54) INTERGRATED CIRCUIT SELF-TEST ARCHITECTURE

(75) Inventors: Marcel Pelgrom, Helmond (NL); Hendricus J M Veendrick, Heeze (NL)

(73) Assignee: NXP B.V., Eindhoven (NL)

( * ) Notice: Subject to any disclaimer, the term of this patent is extended or adjusted under 35 U.S.C. 154(b) by 56 days.

(21) Appl. No.: 11/720,317

(22) PCT Filed: Nov. 23, 2005

(86) PCT No.: PCT/IB2005/053883

§ 371 (c)(1),
(2), (4) Date: Apr. 22, 2008

(87) PCT Pub. No.: WO2006/056951

PCT Pub. Date: Jun. 1, 2006

(65) Prior Publication Data

US 2008/0272797 A1    Nov. 6, 2008

(30) Foreign Application Priority Data

Nov. 29, 2004    (EP)    .................................. 04106128

(51) Int. Cl.
*G01R 31/02*    (2006.01)
(52) U.S. Cl. ...................................... 324/763

(58) Field of Classification Search .............. 324/158.1, 324/763–765
See application file for complete search history.

(56) References Cited

U.S. PATENT DOCUMENTS

| | | | | |
|---|---|---|---|---|
| 5,563,524 A | * | 10/1996 | Ungar | .................. 324/765 |
| 5,804,960 A | * | 9/1998 | El Ayat et al. | ............. 324/158.1 |
| 6,556,021 B1 | * | 4/2003 | Nguyen et al. | .............. 324/537 |
| 7,285,948 B2 | * | 10/2007 | Tran et al. | ................. 324/158.1 |
| 7,538,570 B2 | * | 5/2009 | Pelgrom et al. | ............. 324/771 |

FOREIGN PATENT DOCUMENTS

| | | |
|---|---|---|
| EP | 0657815 A | 6/1995 |
| WO | 2004/068156 A | 8/2004 |

* cited by examiner

*Primary Examiner*—Ha Tran T Nguyen
*Assistant Examiner*—Joshua Benitez

(57) ABSTRACT

An integrated circuit (1) comprises a monitor (M1, M3, M3) operable to produce monitor data in dependence upon a measured parameter of the integrated circuit (1); and a self test controller (28) connected to receive monitor data from the monitor (M1, M2, M3). The self-test controller is also operable to output self test data from the integrated circuit. The monitor includes an output shift register (SR1, SR2, SR3) and is operable to output monitor data through the shift register (SR1, SR2, SR3). Such a system enables simplified communication of system self test results on an integrated circuit.

6 Claims, 3 Drawing Sheets

INTERGRATED CIRCUIT SELF-TEST ARCHITECTURE

FIELD OF THE INVENTION

The present invention relates to integrated circuit (IC) architectures, and in particular to signal integrity self-test (SIST) architectures.

BACKGROUND OF THE INVENTION

Advances in manufacturing technology have enabled larger and denser circuits to be placed on single semi-conductor integrated circuits. This is especially the case when the circuits are realised as regular or cellular structures, for example Random Access Memory. A major problem associated with high density device is that of testing. In order to maintain higher reliability, device test procedures need to provide good coverage of possible faults that occur in the integrated circuit.

One technique for providing testing of an integrated circuit is the so-called SIST architecture (signal integrity self-test architecture). The purpose of SIST architecture is to allow real time monitoring of important parameters which characterise the electrical behaviour of the integrated circuit. For example, monitors can be provided to detect cross talk, supply noise, substrate noise, temperature, switching activity, clock duty cycle etc. An SIST architecture has the advantage that testing can be performed before use during a test and debug process, and also during use (on-line).

FIG. 1 of the accompanying drawings is a block diagram illustrating an integrated circuit including previously considered Signal Integrity Self Test (SIST) architecture. The integrated circuit 1 comprises a number of functional cores or modules 2. These modules may perform analogue, digital or memory functions. For simplicity, it has been assumed that all cores are the same size. It will be readily appreciated that such techniques are not limited to an integrated circuit having cores of the same size. In addition, the normal interconnections and buses, which perform communication controls between the different functional cores, have been omitted from the diagram for the sake of clarity.

The integrated circuit 1 includes a monitor control block 4 which communicates with a number of monitors (not shown in FIG. 1) using a monitor selection bus 6. A reference and compare circuit 8 outputs a self-test signal from an output 10 in dependence upon received signals from the monitors. The monitors supply monitor output signals via a bus structure 12. The monitors are intended to be designed as standard cells, so that they can be located anywhere within each standard-cell block.

FIG. 2 of the accompanying drawings illustrates a functional core 2 from the integrated circuit of FIG. 1. The core 2 includes a plurality of monitors 16 connected to a decoder 14 and to the bus structure 12. In FIG. 2, the functional blocks relating to the function of the core have been omitted for the sake of clarity. FIG. 2 illustrates an exemplary core having four monitors 16. It will be readily appreciated that the core can be provided with any number of monitors in dependence upon the parameters to be measured. As mentioned above, different sensors are used to monitor different phenomena: cross talk, supply noise, substrate noise, temperature, switching activity, clock duty-cycle, etc.

The SIST architecture (FIG. 1) allows access to each individual monitor in a core using the monitor selection bus 6, which is controlled by the monitor control block 4. The monitor control block 4 includes a memory, which contains specific codes through which a certain monitor in a specific core can be selected. The output of the selected monitor is usually converted to a DC value or into a differential signal, which is then connected to the bus structure 12. This bus structure 12 may either be connected directly to a bondpad 10 of the integrated circuit, or, as shown, it may be connected to the reference and compare circuit 8. In one particular example, the reference and compare circuit 8 operates to determine whether the output signal from the monitor is within a certain allowed range. The reference and compare block 8 may contain reference values for each kind of monitor.

The monitor control block 4 can be placed on the integrated circuit, but can also be an external controller, for example a software program or an analysis tool. In all cases, it is necessary to provide a means to communicate between all monitors 16 and the monitor control block 4.

Such previously considered SIST architectures have the disadvantage that interfacing between the SIST monitors and the controller is complex. It is therefore desirable to provide a simplified interfacing technique for SIST architectures.

SUMMARY OF THE PRESENT INVENTION

According to one aspect of the present invention there is provided an integrated circuit comprising: a monitor operable to produce monitor data in dependence upon a measured parameter of the integrated circuit; and a self test controller connected to receive monitor data from the monitor, and operable to output self test data from the integrated circuit, characterised in that the monitor includes an output shift register and is operable to output monitor data through the shift register.

According to another aspect of the present invention, there is provided a method of operating signal integrity self test on an integrated circuit, the method comprising: monitoring a parameter of the integrated circuit using a first monitoring and producing monitor output data therefrom; supplying the monitor output data to a self test controller; and supplying self test output data in dependence upon the monitor output data, characterised in that supplying the monitor output data comprises: loading a first shift register associated with the first monitor with the monitor output data; clocking such monitor data through the first shift register; and outputting the monitor data from the first shift register.

DESCRIPTION OF THE PREFERRED EMBODIMENTS

Embodiments of the present invention are concerned with providing simplified communication with monitors on an integrated circuit, and to allow savings in the area occupied by the monitors on the integrated circuit.

Figure 1:
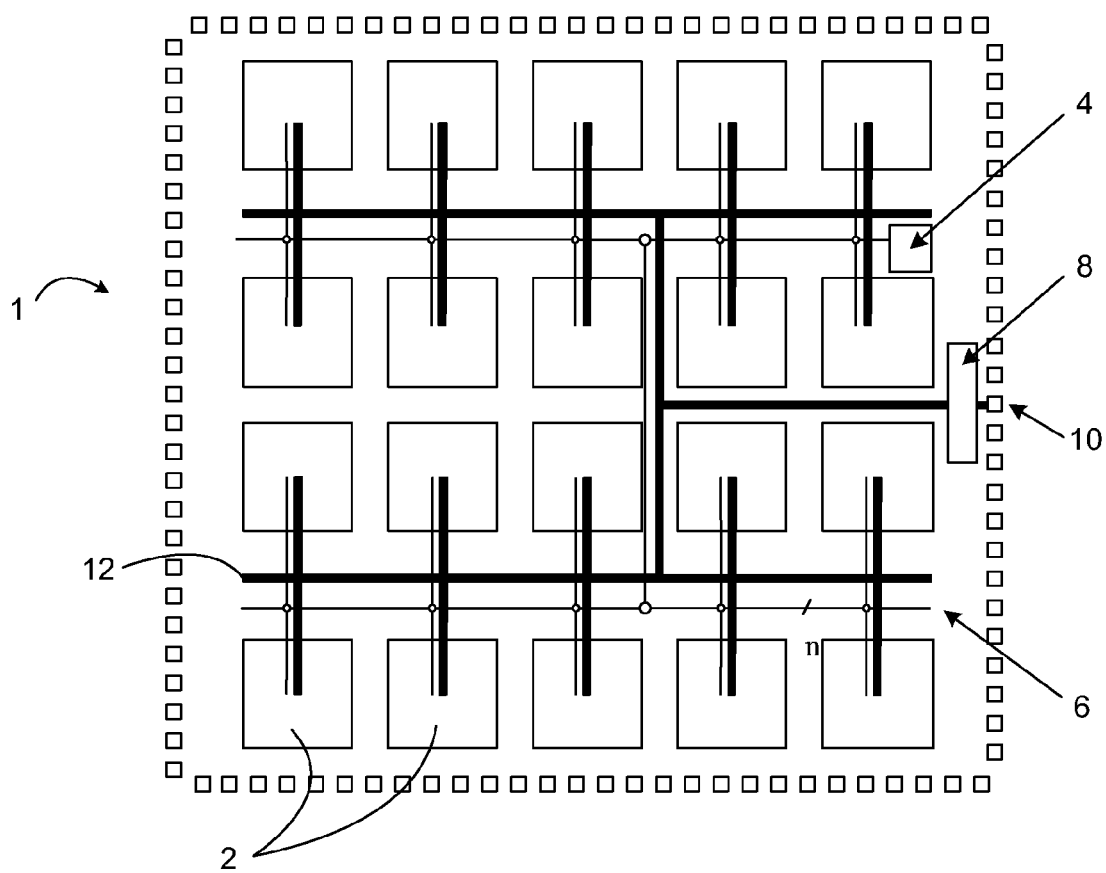
FIG. 1 is a block diagram illustrating a SIST architecture of an integrated circuit.
Figure 2:
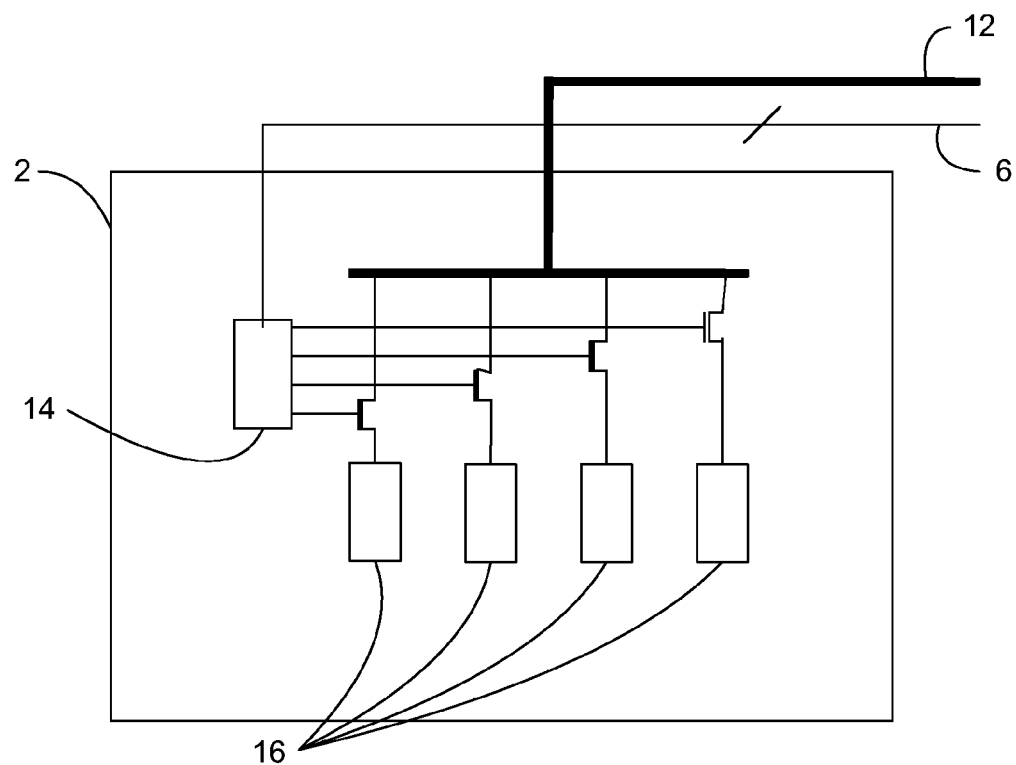
FIG. 2 is a block diagram illustrating a functional core of the architecture of FIG. 1.
Figure 3:
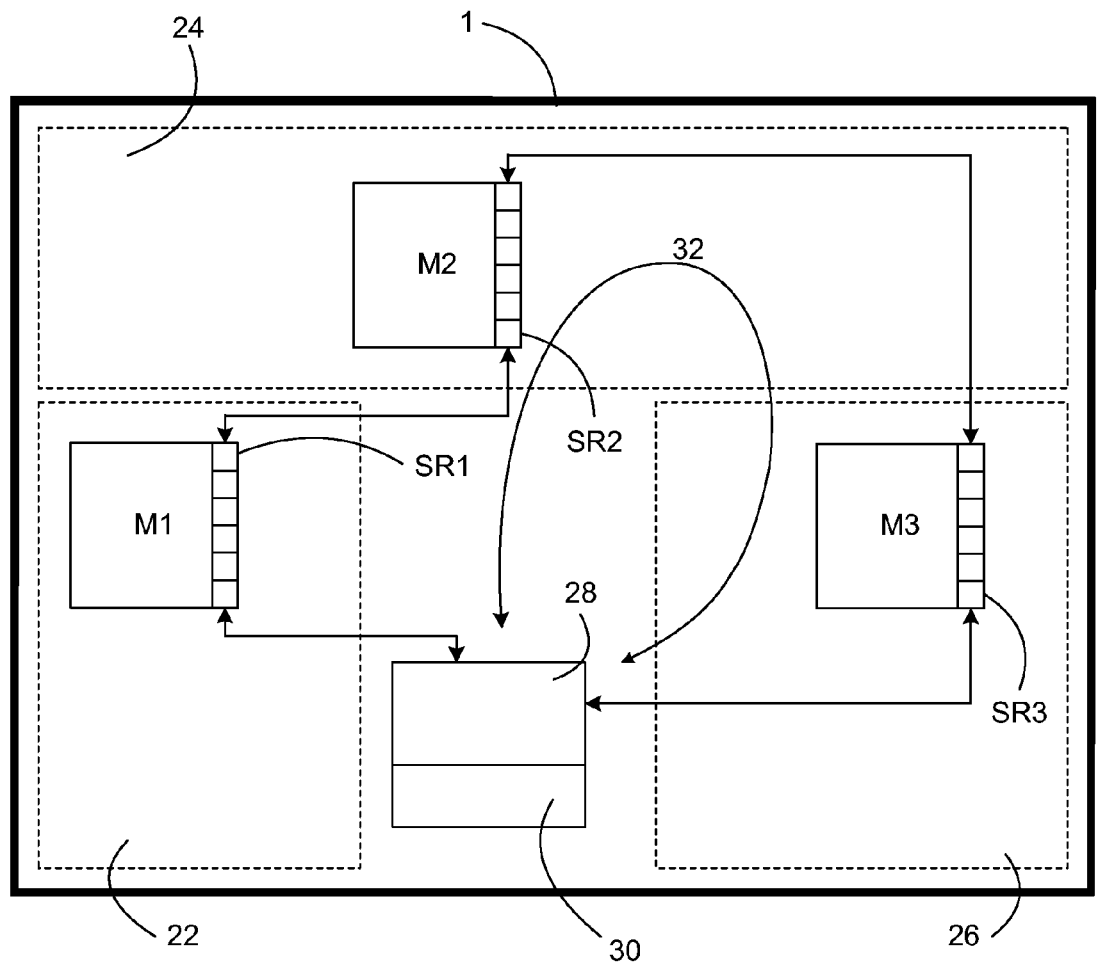
FIG. 3 is a block diagram illustrating one embodiment of an aspect of the present invention.

In embodiments of the present invention the means for providing communication with the monitors is implemented as a shift register, as illustrated in FIG. 3. In FIG. 3, an integrated circuit 1 is provided with three functional blocks, 22, 24 and 26. Each of these blocks performs a function appropriate to the operation of the integrated circuit. It will be appreciated that the integrated circuit can be provided with any number of functional blocks, of any size, and performing any function for the integrated circuit 1.

The integrated circuit 1 is provided with an SIST controller 28 which itself has an interface 30. The SIST controller 28 operates to control signal integrity self test functions of the integrated circuit 1 and to output SIST results from the integrated circuit using the interface 30.

Each of the functional blocks 22, 24, 26 is provided with at least one monitor M1, M2, M3. It will be readily appreciated that the number of monitors is not limited by the present invention, and that the monitor or monitors can provide any appropriate output measurements.

Each of the monitors M1, M2, M3 is provided with a monitor interface (SR1, SR2, SR3) for supplying outputs to the SIST controller 28. In embodiments of the present invention, these monitor interfaces are provided by shift registers SR1, SR2, SR3. The shift registers SR1, SR2, SR3 and the SIST controller 28 are connected in series with one another to form a shift register loop 32. Each shift register SR1, SR2, SR3 operates in conventional manner, and can accept data input at either end thereof. That is, data is supplied to one end of the shift register and subsequent clock cycles cause the data to move through the shift register until being output from the shift register concerned. Data can be transferred around the shift register loop 32 in either direction, under the control of the SIST controller 28.

Measurements output by the monitors M1, M2, M3 are supplied to the respective shift registers SR1, SR2, SR3 for transfer, via the shift register loop 32, to the SIST controller 28. Using such a loop 32 of shift registers SR1, SR2, SR3 enables the number of communication lines to be reduced in contrast with previous techniques. Indeed, the shift register loop used in embodiments of the present invention allows the use of a single communication wire for the monitor outputs. The SIST controller 28 controls transfer of data through the shift registers and ultimately output from the interface 30. The SIST controller 28 clocks measurement data from one position in the shift register concerned to the next position, or to the next shift register, or to the controller 28, as appropriate. The clocking of data around the loop 32 can be synchronized to make maximum use of the shift register positions, by avoiding conflicts of data.

In such a technique, data output from a monitor is transferred around the loop 32, through one or more of the shift registers, until it reaches the SIST controller 28 for processing.

Figure 4:
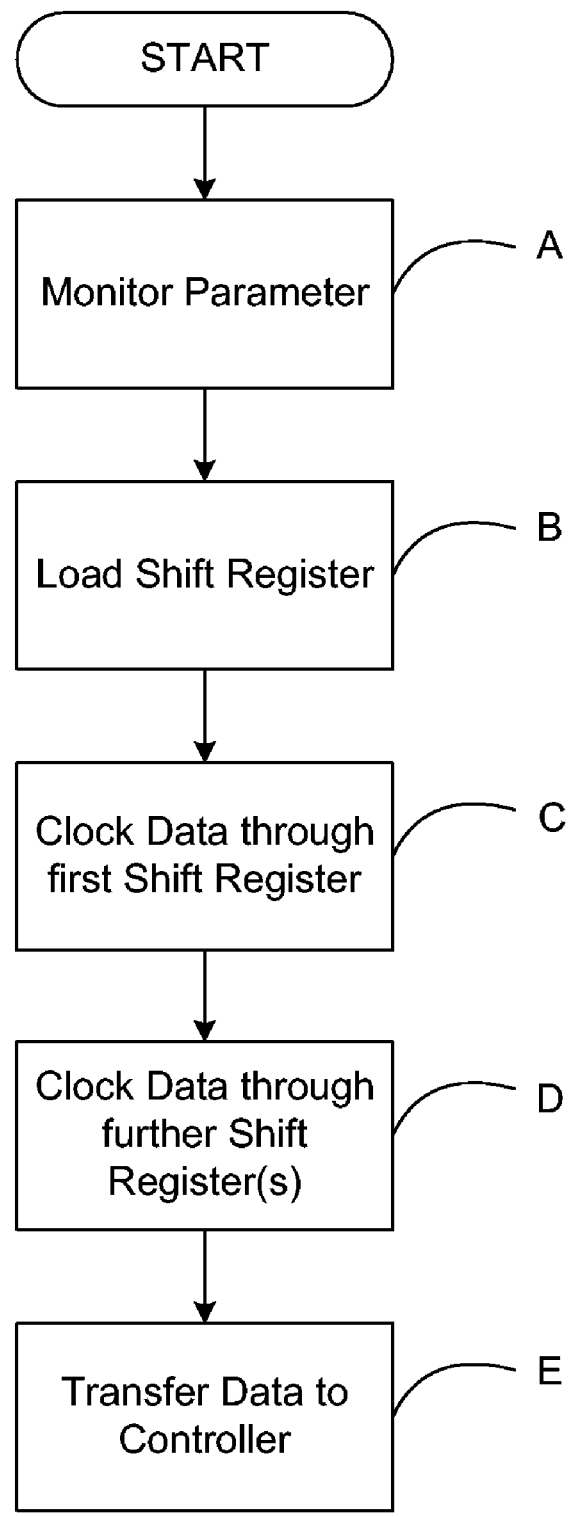
FIG. 4 is a flow chart illustrating a method embodying another aspect of the present invention.

FIG. 4 is a flowchart illustrating steps in a method embodying one aspect of the present invention. At step A, the monitor operates to monitor the associated parameter of the integrated circuit to produce monitor data. At step B, the shift register of the monitor concerned is loaded with the monitor data, and at Step C the data is clocked through the first shift register. Step D illustrates that the clock data is then clocked through the further shift registers as required, in order that the data can be transferred to the controller at Step E. It will be readily appreciated that each monitor in the integrated circuit can monitor parameters and load its own shift register at any time when there is a free shift register slot available. In addition, a monitor may produce more than one monitor output, which are clocked in series around the shift register loop 32. It will also be readily appreciated that for the last shift register in the loop, the data is clocked through that shift register and directly transferred to the controller, and does not need to be clocked through further shift registers. In effect, step D is omitted for the last monitor in the loop.

The major advantages of this communication technique are that it is flexible (it still allows various forms of implementation and control of the monitors). It is bi-directional and single wire, which results in small area and reduced costs and re-use can be made of existing knowledge in controlling these monitors, since only minor modifications are necessary to use scan test input/output pads of the integrated circuit.

In exemplary embodiments of the present invention, the monitors 16 output values in one of the following formats:

The monitor determines the required value in a digital format, e.g. an 8-bit word. and sends it to the monitor control block 4. Such monitors use an analogue-to-digital conversion to convert a measurement to the required output format.

The monitor acts as a decision element: it compares the value of the characteristic to a setting provided by the monitor control block. The result of the comparison is output in digital form.

The invention claimed is:

1. An integrated circuit comprising:
    a monitor operable to produce monitor data in dependence upon a measured parameter of the integrated circuit; and
    a self test controller connected to receive monitor data from the monitor, and operable to output self test data from the integrated circuit through a single communication wire,
    wherein the monitor includes an output shift register and is operable to output monitor data through the shift register,
    at least one additional monitor having a corresponding output shift register, the shift registers of the monitors and the controller being connected together in series to form a shift register loop in which each shift register, except the last in the loop, is connected to the next shift register in the loop, the controller being connected in series between the first and last shift registers of the loop;
    wherein data is transferred around the loop in either direction controlled by the controller and the data is transferred around the loop bi-directionally; and
    wherein a clocking of the data is synchronized around the loop to avoid conflicts of the data.

2. An integrated circuit as claimed in claim 1, wherein each monitor in the integrated circuit loads a shift register when there is a free shift register slot available.

3. An integrated circuit as claimed in claim 2, wherein a monitor produces more than one monitor output, which are clocked in series around the loop.

4. A method of operating signal integrity self test on an integrated circuit, the method comprising:
    monitoring a parameter of the integrated circuit using a first monitor and producing monitor output data therefrom;
    supplying the monitor output data to a self test controller; and
    supplying self test output data in dependence upon the monitor output data through a single communication wire,
        wherein supplying the monitor output data comprises:
        loading a first shift register associated with the first monitor with the monitor output data;
        clocking such monitor data through the first shift register; and
        outputting the monitor data from the first shift register;
    transferring the monitor output data from the first shift register to a first further shift register of a plurality of further shift registers connected in series for transfer of data between consecutive shift registers in the series;

clocking the monitor output data through the plurality of further shift registers; and outputting the monitor output data from a last shift register in the series;

wherein the first shift register, the plurality of further shift registers, and the self test controller are connected together in series to form a shift register loop in which each shift register, except the last in the loop, is connected to the next shift register in the loop, wherein transferring the monitor output data comprises transferring the monitor output data around the shift register loop in either direction controlled by the self test controller, wherein transferring the monitor output data further comprises transferring the monitor output data around the loop bi-directionally; and synchronizing a clocking of the monitor output data around the loop to avoid conflicts of the monitor output data.

5. A method as claimed in claim 4 further comprising loading a shift register when there is a free shift register slot available.

6. A method as claimed in claim 5 further comprising:

producing more than one monitor output data using a monitor; and clocking the more than one monitor output data in series around the loop.

* * * * *